United States Patent [19]

Eddington et al.

[11] Patent Number: 5,165,017
[45] Date of Patent: Nov. 17, 1992

[54] AUTOMATIC GAIN CONTROL CIRCUIT IN A FEED FORWARD CONFIGURATION

[75] Inventors: Donald K. Eddington, Boston, Mass.; Richard C. Gerdes, Tucson, Ariz.

[73] Assignee: Smith & Nephew Richards, Inc., Memphis, Tenn.

[21] Appl. No.: 485,863

[22] Filed: Feb. 23, 1990

Related U.S. Application Data

[63] Continuation of Ser. No. 940,569, Dec. 11, 1986, abandoned.

[51] Int. Cl.⁵ .......................... H04F 25/00; H03G 7/00
[52] U.S. Cl. .................................. 381/68.4; 381/106; 333/14; 330/281
[58] Field of Search ...................... 381/68.4, 106, 107, 381/68, 102, 104, 120; 333/14; 330/148, 281

[56] References Cited

U.S. PATENT DOCUMENTS

| | | | |
|---|---|---|---|
| 3,665,332 | 5/1972 | Campbell | 330/29 |
| 3,808,540 | 4/1974 | Kabrick | 381/107 |
| 3,920,931 | 11/1975 | Yanick, Jr. | 381/68.2 |
| 4,118,604 | 10/1978 | Yanick | 381/68.4 |
| 4,181,818 | 1/1980 | Shenier | 381/72 |
| 4,202,238 | 5/1980 | Moog | 84/1.27 |
| 4,313,215 | 1/1982 | Jansen | 455/212 |
| 4,371,842 | 2/1983 | Lee | 330/141 |
| 4,398,261 | 8/1983 | Saint-Oyant et al. | 364/571 |
| 4,405,831 | 9/1983 | Michelson | 381/68.4 |
| 4,422,049 | 12/1983 | Akagiri et al. | 330/134 |
| 4,459,557 | 7/1984 | McQuilken | 330/282 |
| 4,512,350 | 4/1985 | Cimilluca | 128/660 |
| 4,521,738 | 6/1985 | Akagiri et al. | 330/134 |
| 4,531,229 | 7/1985 | Coulter | 381/68 |
| 4,617,913 | 10/1986 | Eddington | 128/1 R |
| 4,630,302 | 12/1986 | Kryter | 381/68.4 |
| 4,718,099 | 1/1988 | Hotvet | 381/68.4 |

OTHER PUBLICATIONS

1978 National Semiconductor Linear Applications Handbook.
Hearing Instruments, "A New Hearing Aid Amplifier Technique", Hans Bergenstoff, vol. 33, No. 9, Sep. 1982, p. 247.

Primary Examiner—Jin F. Ng
Assistant Examiner—M. Nelson McGeary, III
Attorney, Agent, or Firm—Spensley Horn Jubas & Lubitz

[57] ABSTRACT

An input signal representing speech is preamplified, filtered, and fed foward in parallel to Automatic Gain Control (AGC) circuitry and to a gain controllable amplifier. The AGC detects the peak absolute value of the input signal, charing a capacitor in accordance with such detections. The capacitor is discharged at a faster rate (variable down to 1 msec) when a greater charge value is stored but at a slower rate (variable up to 4 seconds) when a lower charge value is stored. The gain controllable amplifier is controlled for gain inversely to the charge value stored on the capacitor. The AGC captures greater than 60 dB of allowable input signal range, compressing such input signal into a (controllable) limited amplitude dynamic range. The AGC provides that 1) environmental background sound is clearly heard in the absence of speech, 2) during speech the gain level is controlled so as not to allow background sounds to come in during normal speech pauses, simultaneous that 3) recovery to desired gain is quick folloiwng plossive sounds present in normal speech. In a preferred embodiment, the AGC circuitry and associated amplification circuitry is implemented as a monolithic semicustom integrated circuit.

30 Claims, 8 Drawing Sheets

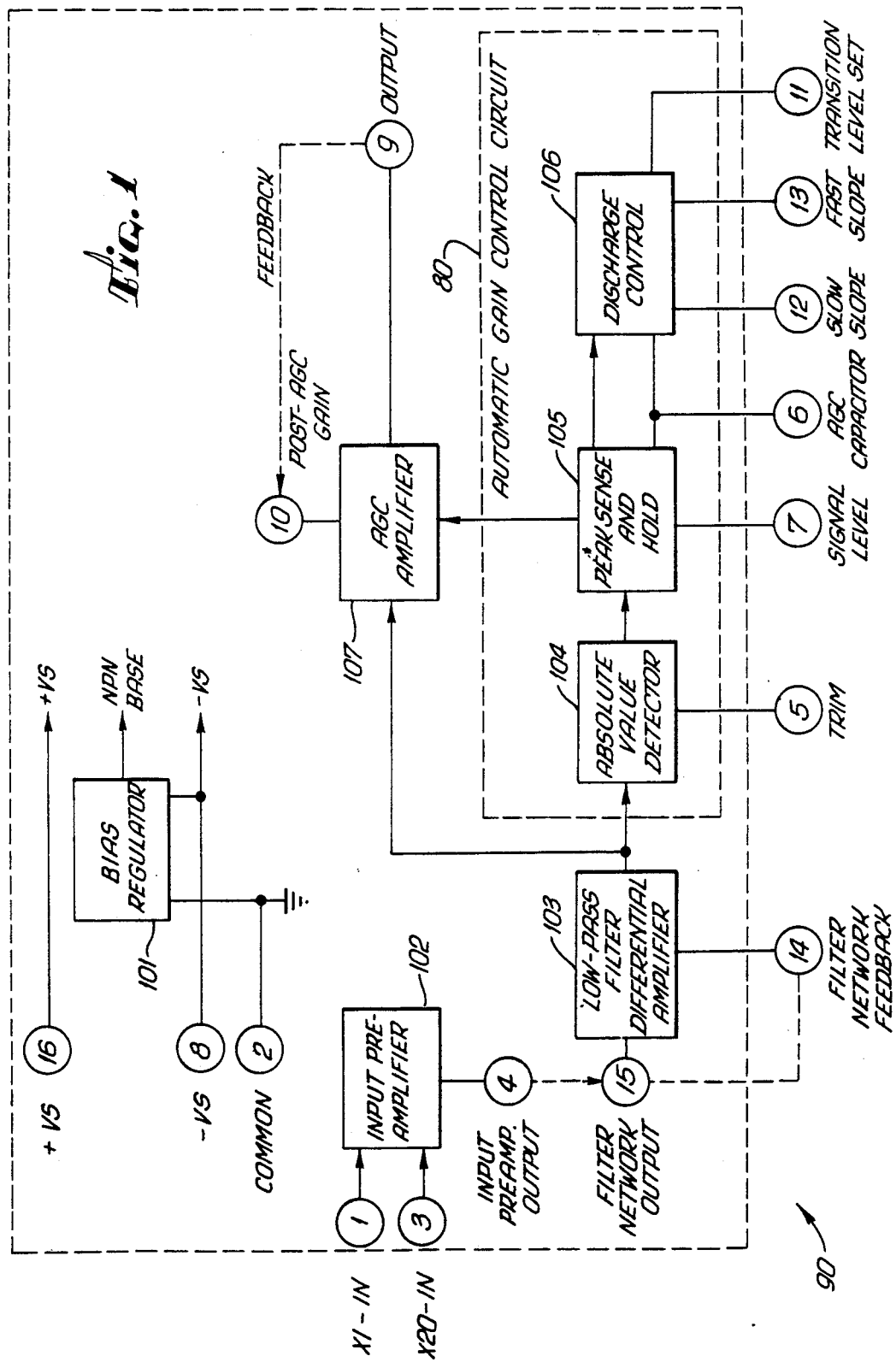

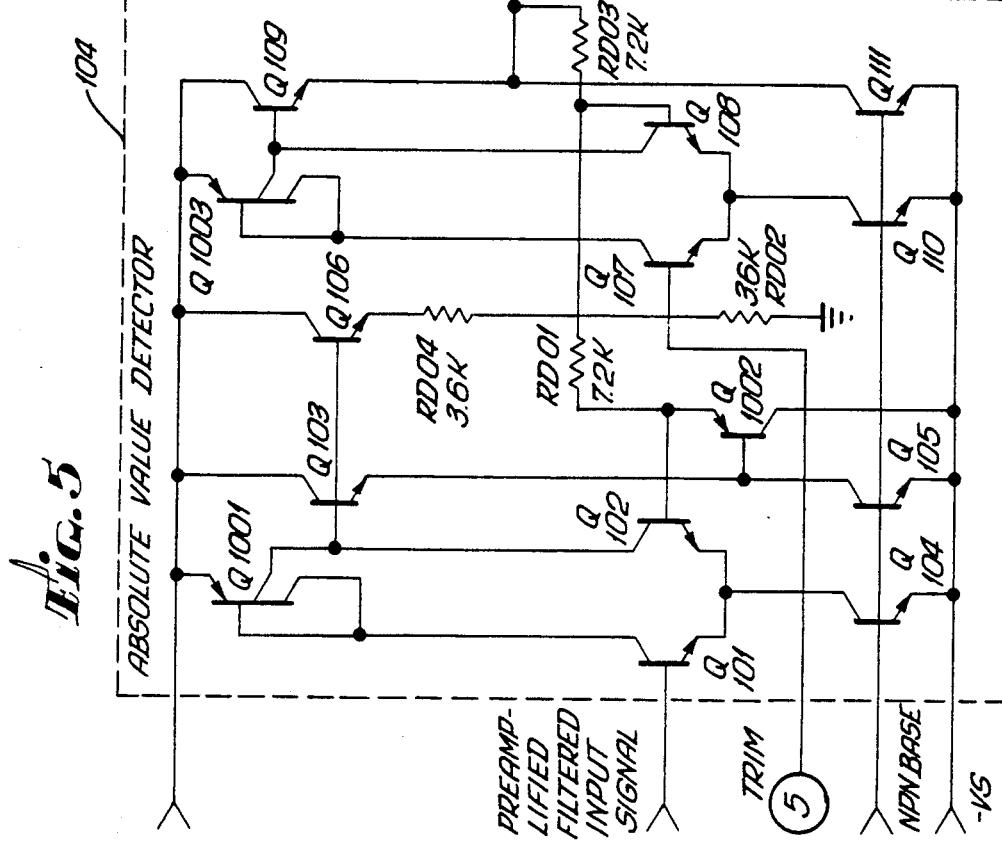
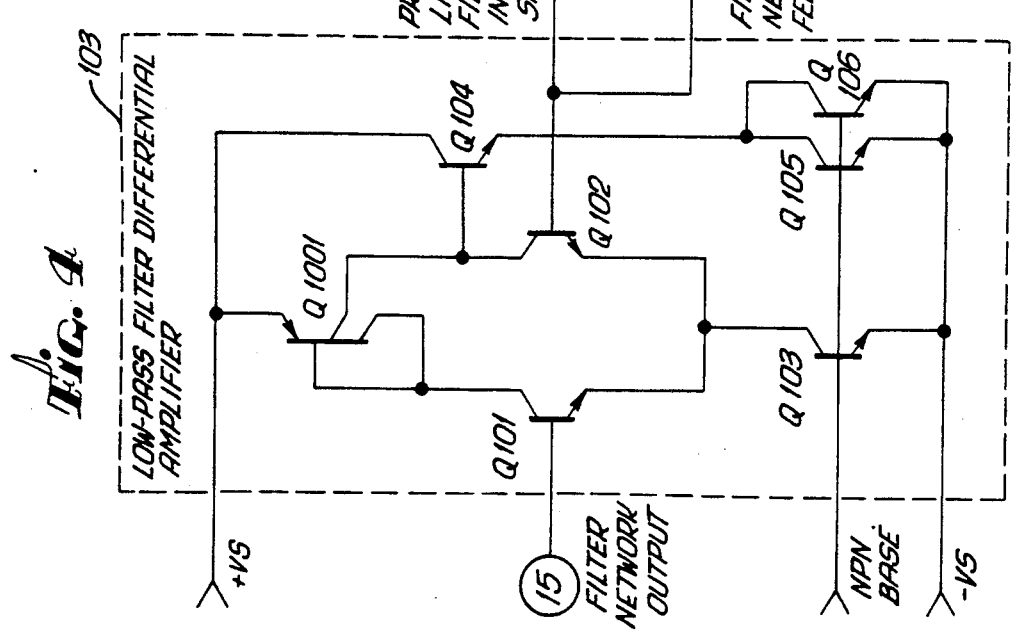

AUTOMATIC GAIN CONTROL CIRCUIT IN A FEED FORWARD CONFIGURATION

This is a continuation of application Ser. No. 06/940,569 filed on Dec. 11, 1986, now abandoned.

BACKGROUND OF THE INVENTION

1. Field of the Invention

The present invention generally concerns automatic gain control of sound amplifier circuits. More particularly, the present invention concerns an automatic gain control circuit for use with a hearing aid device or other device used for speech detection and amplification.

2. Background Information

Circuits used for speech detection, and for aiding the hearing of the partially deaf and hearing impaired, are well known. Many of these circuits incorporate automatic gain control (AGC). One problem which must be dealt with by circuits augmenting and aiding human hearing is that a person with impaired hearing likes to hear the normal environmental sounds around him, but these same sounds interfere with speech discrimination and need to be suppressed in the presence of speech. Simultaneously, a person with impaired hearing usually is sensitive to a limited amplitude dynamic range of sound. The person needs to have the amplitude of sound which is delivered by a circuit aiding hearing to be compressed. This compression is required so that normal sounds, including the normal sounds included in human speech, do not exceed the limited-amplitude sensitivity range and/or the comfort range of the listener. In an artificial hearing device employing implanted electrodes special care must be taken to keep the amplitude of signals, corresponding to sound sensed by the user from the implanted electrodes, within the user's comfort zone.

One approach to implementing a gain control circuit for control of sound amplification is shown in U.S. Pat. Nos. 4,422,049 and 4,521,738 to Akagiri et al. Akagiri et al. describe a gain control circuit for controlling amplification which exhibits a very rapid attack time and which is sensitive to high and low signal levels alike. To manipulate such attack time, Akagiri et al. employ, a dual-acting AGC circuit which uses a feedback system and dual charging capacitors for the purpose of attaining a relatively long release, or recovery, time for small signals without adversely affecting the attack time for large signals.

Another approach to control of gain is shown in U.S. Pat. No. 4,371,842 to Lee. Lee is directed to controlling the gain of amplification of a pulse, or burst, signal as opposed to amplifying continuous analog signals. Lee uses feedback to control the gain of an input amplifier. A dual action is provided by Lee's gain control circuit through a time-out mechanism which switches the AGC attack time to fast if no signal has been detected for a predetermined length of time. If signal pulses are present then the circuit gain stays constant and the amount of suppression of the input signal is dependent upon the peak amplitude of the signal pulses.

U.S. Pat. No. 4,531,229 to Coulter describes a dual acting feedback AGC circuit affecting attack time so that an increased signal level causes a faster attack time. Two capacitors are charged by different paths in order to obtain charging of a quickly charging capacitor and of a slower charging capacitor. The voltage on the capacitors discharges through the same path at the same rate for a single release rate.

U.S. Pat. No. 3,665,332 to Campbell shows a single capacitor within an AGC circuit. The capacitor is discharged more quickly in response to larger signals than smaller signals, thereby according minimal "shadowing" in binaural aids for the hearing impaired. The circuit of Campbell accomplishes this selective discharge through a continuously variable resistance in the discharge path of the capacitor. The feedback voltage controls the value of this variable resistance. The feedback voltage is held on a capacitor. The capacitor thereby establishes a delay time for a change in discharge resistance. The larger a signal causing a reduction in the discharge resistance, the longer the time after the disappearance of the large signal before the resistance returns to the level appropriate to following softer sounds. Alteration of the delay time of the circuit of Campbell appears to be limited to manually changing the value of the capacitor or of other components within the circuit.

U.S. Pat. No. 3,920,931 to Yanick describes a feedback circuit controlling attenuation of an input signal at two suppression gain ratios. A primary feedback path, employed when the signal is soft, controls an input shunt resistance. If either the average level, or a bandpassed peak level, signal intensity goes above a predetermined threshhold, then such shunt resistance is immediately lowered.

U.S. Pat. No. 4,202,238 to Moog describes a dual channel system receiving two input signals. The strength resultant from feeding back one signal is used to reduce that signal and to simultaneously boost the other signal.

U.S. Pat. No. 4,398,261 to Saint-Oyant et al describes the control of gain by digitally switching different attenuators into the signal path. U.S. Pat. No. 4,459,557 to McQuilken shows basic feedback for compression limited amplification of audio signals. U.S. Pat. No. 4,512,350 to Cimilluca describes a circuit which does not alter gain with reference to different input or output signal levels, but rather switches gain dependent upon elapsed time from a reference time.

All the patents discussed in the preceding paragraphs show circuits generally employing a feedback signal. In a feedback system, the system signal output is detected and then the amplification gain is controlled proportionately to this detection. In other words, the output signal sets the gain of the amplification. A disadvantage of feedback is the speed at which one can control the output level. The input signal is required to reach the output before the output level is established in and by a feedback system. This hampers achievement of a very fast attack time for the AGC control amplifier and also results in overshoot. The maintenance of a gain level, and the release, or recovery, from this maintained gain level may also have deleterious effect on the attack time. A fast attack time is always desirable for signals of all levels.

Such prior approaches show, however, in aggregate, that considerable design effort is devoted to the flexible automated control of gain during amplification which is appropriate for many purposes, particularly during amplification of sound in aid to the hearing-impaired.

SUMMARY OF THE INVENTION

The present invention is embodied in an automatic gain control (AGC) circuit of a feed forward as opposed to a feedback design. One advantage of the present invention is that it can accord an equally fast attack time on all input signals, which attack time is essentially equivalent to the input frequency up to the bandwidth. The present invention establishes two rates, a relatively fast rate and a relatively slow rate, of the release, or recovery, of gain responsive to the amplitude of the input signal. This dual-rate gain recovery is implemented in the feed forward configuration automatic gain control (AGC) circuit.

The AGC circuit of the present invention is particularly useful for amplifying sound to assist and aid hearing by the hearing-impaired. The function of the AGC circuit of the present invention in this environment is described in this paragraph and the following five paragraphs. A person with impaired hearing likes to hear the normally softer environmental sounds around him, but these sounds need to be suppressed in the presence of speech because of their interference with speech discrimination. Simultaneously, a person with impaired hearing is usually sensitive to only a limited dynamic range of sound amplitudes. The hearing impaired person needs to have the wider range of amplitudes normally occurring in sound compressed so that such normal sounds, including sounds arising from speech, do not exceed his hearing sensitivity and/or comfort ranges. In the case of a person relying on an artificial hearing device of the implanted electrode type, both these considerations are of even greater significance. The AGC circuit of the present invention fully accommodates these considerations.

The present invention as embodied in an automatic gain control circuit in a feed forward configuration provides gain control of and for amplification of signals representative of sound. At its simplest and most elementary level, such gain control will cause soft sounds to be amplified relatively more, and will cause loud sounds to be amplified relatively less.

The automatic gain control circuit of the present invention will simultaneously control that the sound amplifier will compress input signals over a wide dynamic range (greater than 60 dB) into a limited amplitude dynamic range. This compression occurs with a uniformly fast attack time for all signal amplitudes at all signal input frequencies up to the bandwidth (greater than 10 kHz). At the simplest and most elementary level such gain control makes that both the softest and the loudest sounds will be amplified appropriately to fall within the sensitivity and/or comfort range of a hearing impaired user of an artificial hearing device.

The release, or recovery, time of any level of gain is also a function of an AGC circuit. Whereas a fast attack time is always desirable, the desired release time is strongly dependent upon the nature of sound being amplified. In particular, the suppression of background noise (low sound signal level) during normal pauses in human speech (a moderate sound signal level) requires that the release of gain from that moderate level appropriate to amplification of human speech should be sufficiently slow so as to allow normal pauses, or periods of low sound level, to be spanned. At the same time, human speech contains loud, plosive, sounds. A gain control circuit with a fast attack time will appropriately lower gain in response to such a loud sound (a high sound signal level). Immediately following such loud, plosive, sounds are softer syllables which must be more highly amplified in order that the speech can best be understood by the user of a hearing device. These quickly following softer syllables demand the rapid recovery of gain. Obviously there is a considerable challenge to the best management of recovery time by an AGC circuit during the amplification of human speech.

The automatic gain control circuit of the present invention functions so that the release, or recovery, time to a particular level of gain will, dependent upon input signal levels, occur either at a fast (variable to as little as one millisecond) or at a slow (variable to as much as four seconds) rate. In the absence of speech (a low input signal) the gain will be controlled (be elevated) so that environmental background sounds will be clearly heard. When the presence of speech slightly louder than the background is detected (a moderate input signal), then the fast attack time of the AGC circuit will immediately set the gain to desired levels (moderate gain) and will suppress the background noise without such background noise coming in during normal pauses in speech. This suppression is accomplished because the release, or recovery, to another gain level (a higher gain level) from the existing moderate gain level will be slow. At the same time that background sound is being blocked out during normal speech (moderate sound signal level), further normally-occurring plosive sounds (characterized by large sound signal levels) present in speech will, responsive to the fast attack time of the AGC circuit, not be amplified beyond the target limited-amplitude dynamic range of the ear (or the comfort zone in the case of electrode stimulation). Yet the recovery of gain will be controlled such that the normally soft sounds (low or moderate sound signal levels) following such plosive speech sounds will be clearly heard! This is accomplished in the AGC circuit because the low gain accompanying a large amplitude input sound signal will be rapidly recovered to moderate gain, suitable to amplify the continuing speech of low or moderate input signal level, following the termination of such large amplitude input sound signal.

Further to this dual rate of the recovery of gain, the user of the AGC circuit of the present invention has two controls. The Volume control sets the maximum amplitude output. This is the compression "lid": all sounds will produce an output level at or below this limit regardless of their input amplitude. The second control available to the user is the Sensitivity control, also called the pre-AGC gain. It should be understood that the absolute internal voltage level at which the electrical threshold of the rapid, versus slower, recovery of gain transpires is set at the factory in the tuning and alignment procedure of the AGC circuit of the present invention by an internal adjustment not accessible to the user. However, by use of the Sensitivity control the user can vary the voltage level produced by a given sound intensity. This will correspondingly vary the sound intensity which corresponds to that electrical threshold at which rapid, versus slower, recovery of gain transpires. These two adjustments thus optimize the performance of a hearing aid device incorporating the circuit of the present invention at varying levels of background noise to speech level.

The electrical operation of the AGC circuit of the present invention is as follows. The AGC circuit of the present invention is positioned in a feed forward configuration in that it receives an input signal in parallel with the receipt of the identical input signal by an amplifier for which the gain will be controlled. The AGC circuit detects the absolute magnitude of the input signal and develops a value representative of such magnitude. This value is held. The value held would become, over time, representative of the peak magnitude ever occurring in such input signal, save that there is within the AGC circuit of the invention an additional means for diminishing the held value.

The gain of the amplifier to be controlled is controlled inversely proportionately to the value held. This means that the gain is relatively greater when such value held is relatively smaller, and is relatively smaller when such value held is relatively greater. As mentioned, such held value (the peak value) is further operated upon by the diminishing means which acts, over time, to diminish the value held. Further, such diminishing over time of the held value will occur proportionately to, and responsive to, the size of such held value itself! The diminishing of the held value will occur relatively more quickly and strongly when the held value is relatively larger, and relatively more slowly and weakly when the held value is relatively smaller. This variable rate of diminishing actually occurs at two separate and distinct rates: a fast rate and a slow rate. Since the gain of the amplifier is controlled inversely proportionately to the value held, the two different rates of the diminishing of the value held will serve to establish two different rates, a fast rate and a slow rate, at which the gain response of the amplifier will be recovered.

In electrical terms, a signal representative of detected sound, which signal is optionally preamplified and passed through a low-pass filter, is applied as a fed-forward input signal to the automatic gain control (AGC) circuit of the present invention. The same signal is simultaneously applied, in parallel, to an amplifier for which gain is controllable. The AGC circuit consists of 1) absolute value detection circuitry for detecting the absolute magnitude of the input signal, and 2) peak absolute value holding circuitry for attempting to hold as a held value the peak absolute magnitude previously detected, being also responsive to 3) diminishing circuitry for driving the held value down from such peak absolute magnitude. The actual electrical circuit for holding the held value uses a capacitor. Charging circuitry responsive to the detected absolute magnitude will attempt to charge such capacitor. The charge held upon the capacitor represents the held value. Discharging circuitry, sensing the charge value held upon the capacitor, is interactive for discharging this charge value held on the capacitor relatively more quickly when the held value is relatively larger, and for discharging this charge value held on the capacitor relatively more slowly when the held value is relatively smaller. The charging circuitry and the discharging circuitry are simultaneously active. Finally, the gain control of the amplifier for which gain is controllable will transpire inversely proportionally to the charge value held upon the capacitor: a relatively smaller charge value causes a relatively larger gain and a relatively larger charge value causes a relatively smaller gain.

The net effect of such an AGC circuit in a feed-forward configuration is that the attack time, being that time during which gain is adjusted to the amplitude of the input signal, will be very fast for signals of both large and of small amplitude, being essentially equivalent to the input frequency of the amplifier up to the amplifier bandwidth. A larger input signal will be amplified with relatively smaller gain and a smaller input signal will be amplified with relatively larger gain. Further, the time during which gain is released, or relaxed, responsive to input signals of varying amplitudes will be dependent upon such amplitudes. If the input signals are of moderate amplitude, such as are representative of speech, then the gain will be but slowly recovered during normal periods of silence, meaning input signals of low amplitude, occurring during speech. This means that the normally lower level background noise will not be amplified during normally continuous speech, even should such speech incur small periods of silence. Upon the occurrence of loud, large-signal, plosive sounds, meaning input signals of large amplitude, during normal human speech then the gain will be immediately reduced so that such large amplitude signals might be appropriately amplified. Upon the resumption of normal speech volume, meaning moderate level input signals, then the gain will be quickly recovered to appropriately greater levels. The amplitude level at which the gain is more quickly recoverable versus more slowly recoverable is user-adjustable. The dual rate recovery of gain, and the user adjustment, effectively allow optimization of the amplification of human speech at differing ratios of background noise to such speech, even during the normal occurrence of plosive sounds within such speech.

Correspondingly, it is a first object of the present invention to provide an automatic gain control circuit in a feed forward configuration which circuit accords very fast attack time with very little overshoot. A very fast attack time means that gain will be adjusted upward for a smaller input signal, and downward for a larger input signal, at any signal frequency up to the amplifier bandwidth, the adjustment being essentially as fast as the amplitude of such signal varies. Lack of overshoot means that the adjustment of gain occurring immediately upon the change in amplitude of such signal will not be appreciably different than that gain resulting from a quiescent occurrence of a like amplitude signal.

It is a second object of the present invention that the release time, being that period of time during which gain is recovered to a higher level after the gain had previously been set at a lower level in response to a large amplitude input signal, will occur at two rates: a relatively fast rate and a relatively slow rate. When the input signal is of moderate amplitude, as is representative of normal human speech, then the recovery to higher gain will be relatively slow, spanning the normal pauses, or periods of low amplitude input signals, occurring within such speech. This will have the effect that during such speech pauses then that background noise which is, other than during such silence periods in human speech, strongly amplified so that a hearing-impaired user may be aware of his environmental background, will during pauses in speech not be strongly amplified, and intrusive into, such pauses. Alternatively, after the occurrence of large amplitude input signals, such as represent plosive sounds during human speech, then the gain, having been appropriately reduced during the amplification of such plosive sounds, will be very quickly recovered to the appropriate level for the amplification of the normal speech occurring immediately after such plosive sounds.

It is a third object of the present invention to allow the user to adjust the balance between the slow release time and the fast release time. The release time is that period during which gain, previously depressed to lower levels, will be recovered to higher levels. This means that the circuit of the present invention when employed in a hearing aid device can be optimized under user control for varying ratios of background noise versus speech level.

It is a fourth object of the present invention to provide an automatic gain control circuit in a feed forward configuration, plus an amplifier circuit for which gain is controllable, plus a preamplifier circuit, plus a low-pass filter circuit, which are entirely collectively implemented in monolithic custom integrated circuit technology suitable for low power use within portable aids for amplifying sound to the hearing-impaired.

These and other objects of the present invention will become increasingly clear by reference to the drawings and accompanying specification.

Once the flexibility of the automatic gain control circuit in a feed forward configuration of the present invention is recognized, it is possible to adapt several principles of the prior art to the selective control and alteration of such an AGC circuit. These principles include adjusting gain upon the occurrence of certain signal conditions including not merely amplitude but additional waveform characteristics, or upon the occurrence of certain times.

BRIEF DESCRIPTION OF THE DRAWINGS

FIG. 1 shows a block diagram of the automatic gain control circuit of the present invention along with that preamplifier, low-pass filter, and gain-controllable amplifier with which it is monolithically implemented as a custom integrated circuit chip.

FIG. 4 shows a schematic diagram of a low-pass filter differential amplifier which is implemented along with the automatic gain control circuit of the present invention on a monolithic integrated circuit chip.

FIG. 5 shows a schematic diagram of the absolute value detector part of the automatic gain control circuit of the present invention.

DESCRIPTION OF THE PREFERRED EMBODIMENT

Figure 3:
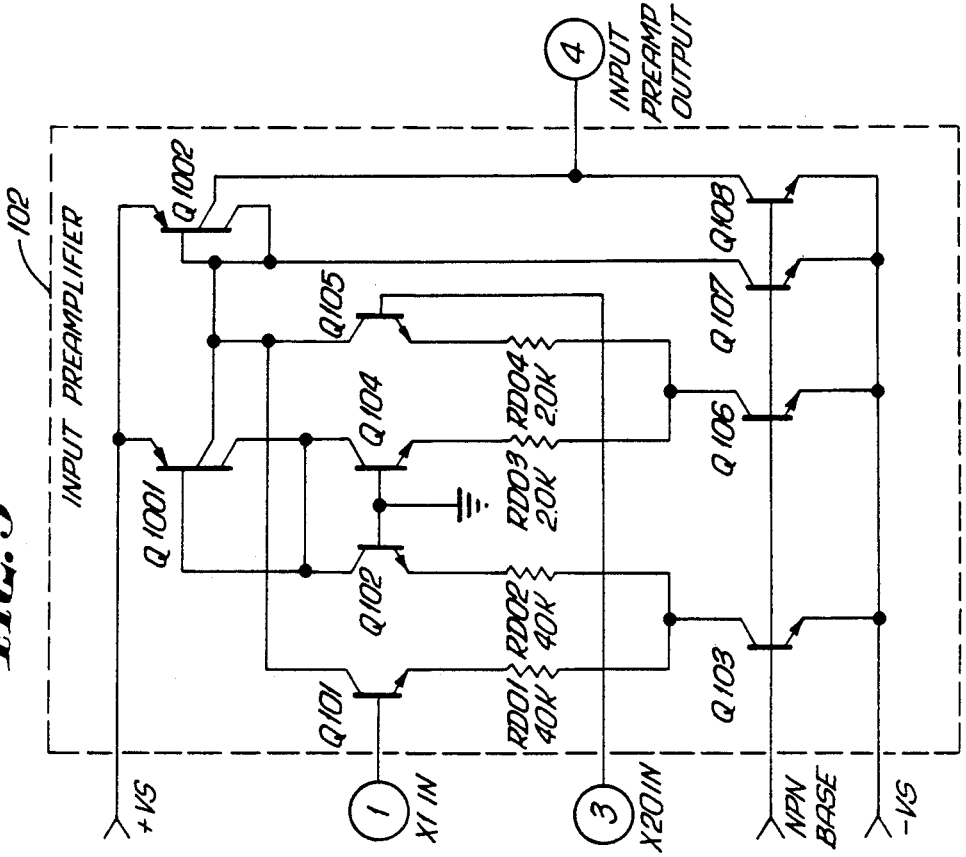
FIG. 3 shows a schematic diagram of an input preamplifier which is implemented along with the automatic gain control circuit of the present invention upon a monolithic integrated circuit chip.

A block diagram of an AGC circuit 80 in accordance with one embodiment of the present invention, and of accompanying circuitry, is indicated generally at 90 in FIG. 1. The automatic gain control (AGC) circuit 80 employs a feed forward configuration in which an input signal is also fed (in parallel to the AGC circuit) to an amplifier circuit for which the gain will be controlled.

The AGC circuit is preferably implemented along with such amplifier for which gain can be controlled, and along with a preamplifier and a low-pass filter, as monolithic custom integrated circuitry. Such a complete automatic gain controlled amplification circuit built as a custom chip is particularly useful for the amplification of sound in aids to the hearing-impaired or in artificial hearing devices of the implanted electrode type. An example of a system and application of the latter type of device is disclosed in U.S. Pat. No. 4,167,913, for an Artificial Hearing Device to Eddington.

In one embodiment, the circuitry 90 may be manufactured as a ten layer bipolar semicustom chip. Such a semicustom integrated circuit is but one embodiment of a custom integrated circuit, and but one embodiment of the present invention. In the preferred semicustom circuit embodiment the chip 90, or dice, is made up of six lower layers of semi-custom building blocks and four custom upper layers of metalization interconnect. The lower six layers of the semicustom circuit implement particular semi-custom integrated circuit development blocks available from several manufacturers and classified under the generic name "standard 20 volt bipolar". The upper four layers of metalization interconnect, such as will be described in the schematic diagrams of the present disclosure, contain the appropriate electrical paths to interconnect the bottom six layers in order to construct a functioning integrated circuit. Other semicustom and custom fabrications may be implemented. For example, the layers may be completely pre-diffused except for a single metal interconnect layer and a possible passivation layer. The integrated circuit embodiment of the present invention will be connected to, and used with, certain external components which will be further described in conjunction with FIG. 9. The illustrated integrated circuit embodiment of the present invention is nominally packaged in a standard sixteen pin ceramic dual in line package (DIP), although other packagings are possible.

Further in reference to the block diagram of FIG. 1, the circled numbers shown therein represent the nominal pin assignments of signals which are communicated to and from the integrated circuit chip 90 which incorporates, together with other circuitry, the AGC circuit 80 of the illustrated embodiment. The chip 90 includes a BIAS REGULATOR circuit 101 which inputs a regulated tracking complimentary voltage supply of positive voltage amplitude +VS (sometimes called $V_{cc}$) and of equal negative voltage amplitude −VS (sometimes called $V_{bb}$). A chip implemented in bipolar technology will typically operate with the regulated voltage set in the range of ±1.3 volts to ±18 volts, with +VS equal to +15 volts and −VS equal to −15 volts being the nominal voltage supply levels. The BIAS REGULATOR 101 develops a regulated bias voltage as signal NPN BASE. This signal is supplied to the biasing transistors of each internal stage in the chip in order to establish the correct bias under all possible levels of the power voltages (+VS and −VS) supplying such stages.

Continuing to refer to FIG. 1, an INPUT PREAMPLIFIER circuit 102 amplifies a microphone input signal, received as signal X20-IN at pin 3, at a gain of 20 and sums this signal with an auxiliary input signal (received as signal Xl-IN at pin 1 amplified at unitary gain). The preamplifier signal output is made available at pin 4 as signal INPUT PREAMP OUT which will be coupled, as is indicated by the dashed line, to a filter network input pin 15. The overall amplification of the INPUT PREAMPLIFIER 102 can be controlled by varying the impedance seen by this signal INPUT PREAMP. OUT as connected to the filter network. This control is usable as the pre-AGC gain control, or sensitivity, in the specific intended application of the circuit shown in FIG. 1 for the amplification of sound to aid the hearing impaired.

The chip 90 further comprises an externally programmable low pass two-pole filter which includes LOW-PASS FILTER DIFFERENTIAL AMPLIFIER 103. Operation of the LOW-PASS FILTER DIFFERENTIAL AMPLIFIER 103 as a two-pole low-pass filter requires external components represented by the dashed line which proceeds from signal FILTER NETWORK FEEDBACK (pin 14) to signal FILTER NETWORK OUTPUT (pin 15). The corner frequency of the two pole low-pass filter circuit so established is approximately ten kilohertz. The filter is designed to attenuate high frequency, plosive, sounds as well as sudden, rapid increases in amplitude. The manner by which a differential amplifier may have a feedback path established through external components in order to thereby form a low-pass filter will be further shown in FIG. 9. The signal path in FIG. 1 proceeding from the right of LOW-PASS FILTER DIFFERENTIAL AMPLIFIER 103 to AGC AMPLIFIER 107 and in parallel to ABSOLUTE VALUE DETECTOR 104 carries the PREAMPLIFIED, FILTERED, INPUT SIGNAL (as such signal is identified in FIG. 5 and FIG. 8).

Continuing to refer to FIG. 1, the AGC AMPLIFIER 107 will receive the PREAMPLIFIED, FILTERED, INPUT SIGNAL from the LOW-PASS FILTER DIFFERENTIAL AMPLIFIER 103 via an internal connection of the chip, and will amplify this signal in accordance with an AGC control current received of the PEAK SENSE AND HOLD circuit 105. The gain of the AGC AMPLIFIER 107 will also be controlled by an external resistance (RO shown in FIG. 9) in the FEEDBACK path which is represented by the dashed line between the output signal pin carrying signal OUTPUT and the pin carrying signal POST-AGC GAIN. In the preferred application of the chip, which will be further discussed in relation to FIG. 9, this external resistance RO will be variable and is employed as the volume control. The AGC AMPLIFIER 107, which will be further explained in conjunction with FIG. 8, will exhibit gain inversely porportional to the AGC control current received from the PEAK SENSE AND HOLD circuit 105: the higher the AGC control current the smaller the gain of AGC AMPLIFIER 107, and the lower the AGC control current the higher the gain of AGC AMPLIFIER 107.

Further referring to the block diagram of FIG. 1, the AUTOMATIC GAIN CONTROL CIRCUIT receives, as a fed forward signal in parallel to AGC AMPLIFIER 107, the PREAMPLIFIED, FILTERED, INPUT SIGNAL from LOW-PASS FILTER DIFFERENTIAL AMPLIFIER 103 via an internal connection within the preferred embodiment chip implementation. The signal is buffered, half wave rectified, and the two half wave rectified signals are summed to provide a full waved rectified signal which is representative of the absolute value of the signal received—the absolute value of the PREAMPLIFIED, FILTERED, INPUT SIGNAL. A voltage reference received at the signal pin labeled TRIM insures that the negative and positive halves of the input signal contribute equally.

The full wave rectified signal, indicative of the absolute value of the (preamplified and filtered) input signal, is next internally received by PEAK SENSE AND HOLD circuit 105. This circuit applies the signal to the pin labeled AGC CAPACITOR wherein an external capacitor is connected to hold the voltage applied. Importantly, this PEAK SENSE AND HOLD circuit 105 does not allow such capacitor to discharge through it, thereby forcing the peak signal applied to the capacitor to be held until it is discharged by another path. The PEAK SENSE AND HOLD circuit 105 thus acts as a peak detector which holds such peak signal in an external capacitor connected to pin AGC CAPACITOR. The connection at the pin labeled SIGNAL LEVEL is to an open collector output signal which provides a current indicating the level of voltage held upon the external AGC CAPACITOR. This level can be used as a measure of the amount of compression to be applied to the input signal by the AUTOMATIC GAIN CONTROL CIRCUIT. The current also provides a measure of the input signal amplitude level, or magnitude. This voltage level held by the external capacitor connected to pin AGC CAPACITOR will also be used in the PEAK SENSE AND HOLD circuit 105 to produce that signal which is indicated by the arrow-tipped line routed to DISCHARGE CONTROL 106. This signal will also be indicative of the voltage held upon the external capacitor connected to pin AGC CAPACITOR. Finally, and as a third signal indictive of the voltage held upon the external capacitor, the PEAK SENSE AND HOLD circuit 105 will supply a further AGC control signal to the AGC amplifier 107.

The PEAK SENSE AND HOLD circuit 105 is thus involved with receiving an absolute value signal from the ABSOLUTE VALUE DETECTOR 104, and for unidirectionally driving a means for holding this value, a capacitor, only in a first direction toward a held value indicative of the PEAK ABSOLUTE VALUE signal received. The circuit 105 is further for supplying to the DISCHARGE CONTROL 106 a signal indicative of the value held by the capacitor, and as yet another signal indicative of the value held by such capacitor the AGC control signal to the AGC AMPLIFIER 107.

Continuing to describe the AUTOMATIC GAIN CONTROL CIRCUIT of the present invention as block-diagrammed in FIG. 1, the DISCHARGE CONTROL circuit 106 compares the signal amplitude received from the PEAK SENSE AND HOLD circuit 105 to a voltage, set by certain external components, applied to the pin labeled TRANSITION LEVEL SET. The DISCHARGE CONTROL circuit 106 will provide for two alternative discharge paths of the capacitor connected to pin AGC CAPACITOR, to which such circuit visibly connects, depending on the comparison of these two voltages. When the level on the capacitor connected to pin AGC CAPACITOR is more negative than the negative voltage applied to pin TRANSITION LEVEL SET minus two emitter-base voltage drops (approximately 1.4 volts), then a path will be enabled which will discharge charge held on the capacitor through external components connected to pin FAST SLOPE. Conversely, when the voltage on the capacitor connected to pin AGC CAPACITOR is less negative than the voltage applied to the pin TRANSITION LEVEL SET, then the DISCHARGE CONTROL circuit 106 will enable such external capacitor to discharge by a path through external components attached to pin SLOW SLOPE.

By such action selectively enabling two discharge paths, the value stored as charge on the capacitor connected to pin AGC CAPACITOR will be enabled to be diminished, or discharged, relatively faster when such value is large, meaning more positive than the transition level, and relatively slower when such value is small, meaning more negative than the transition level. It should be remembered, in conjunction with the response of the AGC AMPLIFIER 107 to the AGC control signal received of PEAK SENSE AND HOLD circuit 105, that the higher the voltage held by the external holding capacitor connected to pin AGC CAPACITOR, the smaller the gain exhibited by such AGC AMPLIFIER 107. Therefore, when by action of the DISCHARGE CONTROL circuit 106 the charge upon the external capacitor connected to the pin AGC CAPACITOR is discharged quickly, then gain will be more rapidly recovered to a higher level. Conversely, when the charge upon the external capacitor coupled to the pin AGC CAPACITOR is discharged more slowly by action of DISCHARGE CONTROL circuit 106, then the gain of AGC AMPLIFIER 107 will be more slowly recovered from lower to higher levels.

The utility of this response is that input signal levels will normally be moderate, enabling discharge of the capacitor connected to pin AGC CAPACITOR only through components connected to pin SLOW SLOPE of DISCHARGE CONTROL circuit 106, during normal human speech. Such discharge may be adjusted by components connected to such pin SLOW SLOPE to be as long as four seconds. Correspondingly, when short silence periods occur during normal human speech, the charge upon the capacitor connected to pin AGC CAPACITOR will not be much discharged during such short periods by action of DISCHARGE CONTROL circuit 106, and the gain of AGC AMPLIFIER 107 will remain relatively constant. This is desired for amplification of normally continuous human speech.

As another commonly occurring condition during sound amplification, plosive sounds of high amplitude may occur during speech. At such times, the attack and quick reaction of the AUTOMATIC GAIN CONTROL CIRCUIT will make that the voltage developed on a capacitor connected to the external AGC capacitor is very quickly raised, inducing correspondingly desired low gain in AGC AMPLIFIER 107 for amplification of the loud, large amplitude, input signal. When these plosive sounds disappear it is useful that such low gain should not continue over a matter of seconds, according to potential loss of hearing of normal amplitude speech sounds following such plosive sounds, but rather that gain should be recovered quickly. The large amplitude plosive speech sounds, resulting in a large charged value held upon the capacitor connected to pin AGC CAPACITOR, cause discharge occurring through components connected to pin FAST SLOPE by action of DISCHARGE CONTROL circuit 106. Such discharge can be set to a period as short as one millisecond, thereby assuring that the charged value contained on the capacitor connected to pin AGC CAPACITOR will be nearly immediately diminished, or discharged. The gain of AGC AMPLIFIER 107 will correspondingly quickly be increased, thereby ensuring that the normal amplitude sounds following plosive sounds in human speech will not be under amplified, and will not consequently be undetected by a hearing impaired person.

Figure 2:
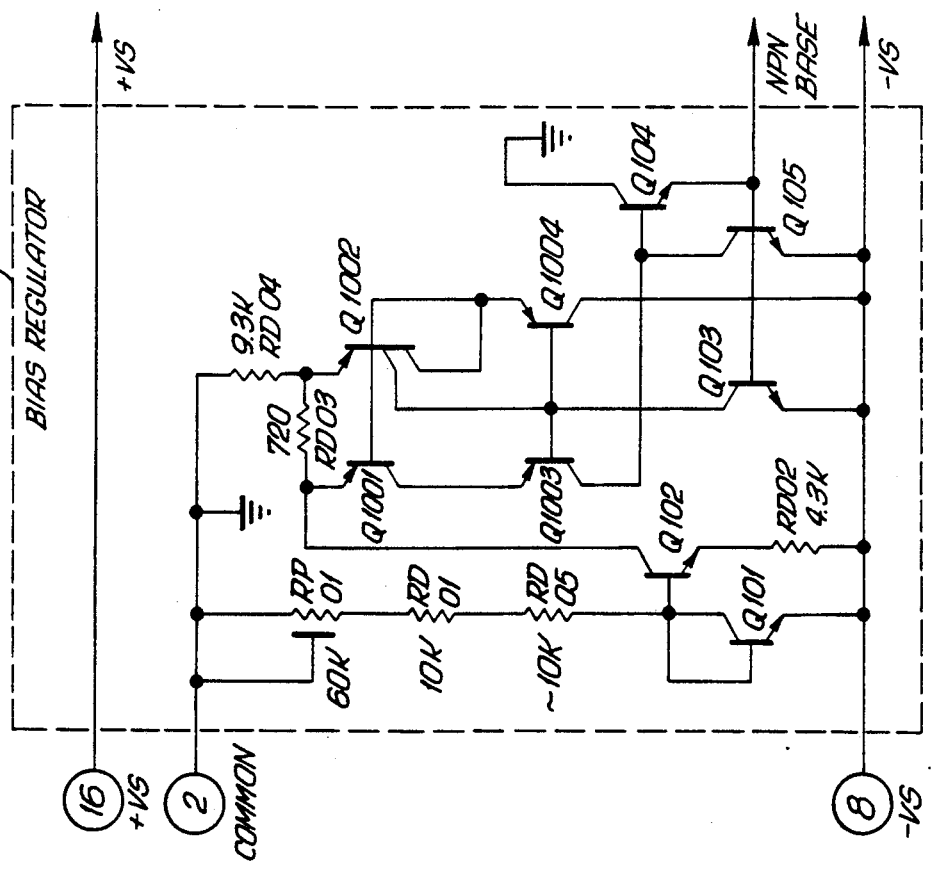
FIG. 2 shows a schematic diagram of a bias regulator, part of the support structure implemented on an integrated circuit chip, to the automatic gain control circuit of the present invention.

The schematic diagram of BIAS REGULATOR 101, previously seen in FIG. 1, is shown in FIG. 2. The BIAS REGULATOR 101 is a circuit controlling the quiescent bias on the transistors of all other circuit functional blocks shown in FIG. 1. An entire monolithic chip consisting of all such circuit functional blocks plus the BIAS REGULATOR 101 is designed and biased to operate on less than one milliampere quiescent current. This allows for battery operation with minimum battery drain according maximum battery life. The BIAS REGULATOR 101 is supplied with a regulated, tracking, complimentary voltage supply consisting of voltage +VS of +1.3 to +18 volts received at chip pin 16 (but not used within the BIAS REGULATOR 101), and of voltage −VS of equal, but opposite value of from −1.3 to −18 volts received at chip pin 8. The positive supply voltage, +VS, is directly distributed on chip. The negative supply voltage, −VS, is sensed relative to the ground, or COMMON, of the input supply which ground is received on chip pin 2. The BIAS REGULATOR 101 comprises transistors Q 1022-Q 1024 and Q 121-Q 125 and RD21-RD25. The BIAS REGULATOR 101, which is a design variation of generally known bias circuits, ultimately transmits from the emitter of transistor Q124 the regulated bias voltage NPN BASE. This biasing voltage NPN BASE, distributed to the biasing transistors of each internal stage in the entire chip, will set the correct bias for the power voltage (+1.3 volts to +18 volts) supply.

Still outside the AUTOMATIC GAIN CONTROL CIRCUIT of the present invention, a schematic diagram of the INPUT PREAMPLIFIER 102, previously seen in FIG. 1, is shown in FIG. 3. The INPUT PREAMPLIFIER 102 includes transistors Q 131 through Q 138 and Q 1031-Q 1032 and resistors RD31-RD34. The INPUT PREAMPLIFIER 102 receives, from internal distribution on chip, the positive supply voltage +VS, the negative supply voltage −VS, and the biasing voltage NPN BASE. The INPUT PREAMPLIFIER 102 accepts an input signal at either chip pin 1 as signal X1N, or at chip pin 3 as signal X20N. The input gains within the INPUT PREAMPLIFIER 102 are fixed such that the output appearing as signal INPUT PREAMPLIFIER OUTPUT on pin 4 will be twenty times greater for the signal X20N than for an equal SIGNAL X1N. The differential transistor pair Q131, Q132 amplifies the X1N signal input, and the differential transistor pair Q134, Q135 amplifies the X20N signal input. The relative gains between these two inputs are controlled by the RD131, RD132 and the RD133, RD134 resistors. The outputs of each of these differential transistor pairs are summed in transistor Q1032, and exit on pin 4 as signal INPUT PREAMP. OUTPUT.

The overall amplification of the INPUT PREAMPLIFIER 102 can be controlled by varying the impedance between this pin 4 and ground. The manner by which the signal INPUT PREAMP. OUTPUT exiting on pin 4 does encounter a variable impedance via its routing to ultimately be received as signal FILTER NETWORK OUTPUT on pin 15 may be observed by momentary reference to FIG. 9. The variable resistance RGA shown therein is used as the pre-AGC gain control, or sensitivity, in the preferred embodiment implementation of the present invention as part of a chip circuit used for the amplification of sound. Returning to FIG. 3, in such a preferred implementation and application, a microphone input would normally be connected to pin 3 in order to provide signal X20N, and pin 1 would provide of the possibility of connecting an auxiliary, optional, source of input signal without disturbing such microphone input.

Continuing to describe the circuitry used with the AUTOMATIC GAIN CONTROL circuit, the schematic diagram of the LOW-PASS FILTER DIFFERENTIAL AMPLIFIER 103 previously seen in FIG. 1 is shown in FIG. 4. The LOW-PASS FILTER DIFFERENTIAL AMPLIFIER 103 includes transistors Q 141 through Q146 and Q1041. The LOW-PASS FILTER DIFFERENTIAL AMPLIFIER 103 is a differential amplifier configured to be used as a low pass filter when external components are added between pin 15 (carrying signal FILTER NETWORK OUTPUT) and pin 14 (carrying signal FILTER NETWORK FEEDBACK). Momentarily referencing FIG. 1, the output of the INPUT PREAMPLIFIER 102 occurring as signal INPUT PREAMP. OUTPUT on pin 4 will be first routed, as indicated by the dashed line, through external components to pin 15 therein reappearing as signal FILTER NETWORK OUTPUT. Momentarily referencing FIG. 9, these external components can be seen in the path connecting pin 4 and pin 15. These components include resistance R1 in series with resistance R2, and capacitor C2 shunting the first input pin 15 of the LOW-PASS FILTER DIFFERENTIAL AMPLIFIER 103 to ground. The signal path to the second input pin 14 of the LOW-PASS FILTER DIFFERENTIAL AMPLIFIER 103 goes through resistance R1 and capacitance C1. Referencing FIG. 4, the connection of the emitter of Q149 to the base of Q142 constitutes a feedback path within the differential amplifier LOW-PASS FILTER DIFFERENTIAL AMPLIFIER 103. If VO is defined to be the voltage out occurring as PREAMPLIFIED, FILTERED INPUT SIGNAL, and VI is defined to be the input voltage between pins 14 and 15, then the Laplacian transfer function of the LOW-PASS FILTER DIFFERENTIAL AMPLIFIER 103 is (with reference to the components shown in FIG. 9):

$$VO/VI = \frac{1/(R1 \cdot C1 \cdot R2 \cdot C2)}{S \cdot S + S \cdot (1/(R1 \cdot C1) + 1/(R2 \cdot C1)) + 1/(R1 \cdot C1 \cdot R2 \cdot C2)}$$

Figure 9:
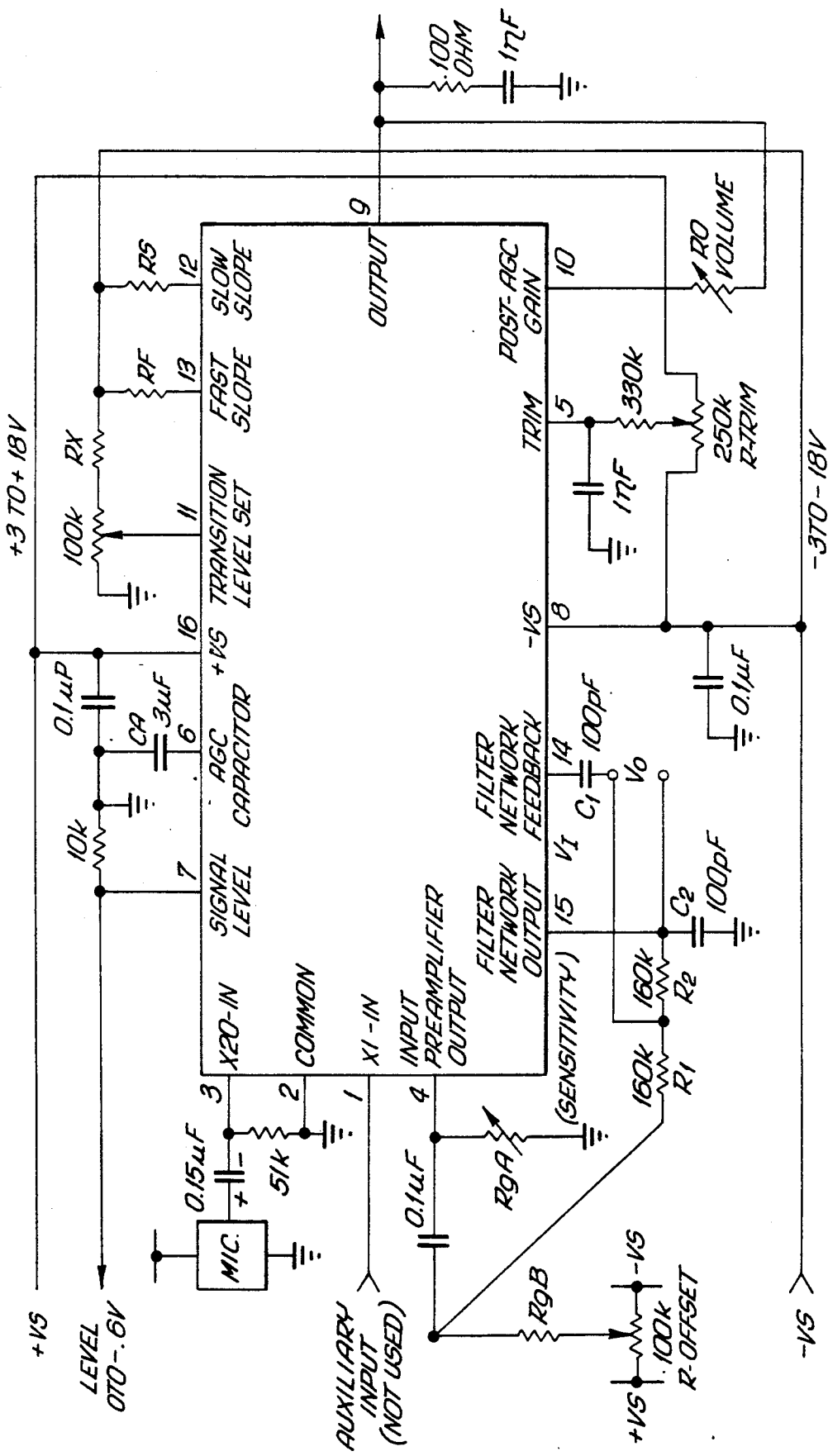
FIG. 9 shows a diagram of the pin usage of, and the interconnections to, the monolithic integrated circuit chip which is block diagrammed in FIG. 1, which chip incorporates the automatic gain control circuit of the present invention.

Continuing in FIG. 4, and also referencing the external filter network components shown in FIG. 9, the filter amplifier circuit shown in FIG. 4 may be observed to be the active component of an active low pass filter which takes the signal INPUT PREAMP. OUTPUT on pin 4 of INPUT PREAMPLIFIER 102 (signal shown in FIGS. 2, 3 and 9) and, such signal first being low pass filtered, then transfers such signal as the internally routed PREAMPLIFIED, FILTERED, INPUT SIGNAL shown in FIG. 4. The low pass filter so created by the LOW-PASS FILTER DIFFERENTIAL AMPLIFIER 103 shown in FIG. 4 and by the interconnected external components shown in FIG. 9 has two poles. The corner frequency of this two pole filter is designed to be 10 kilohertz in order to attenuate high frequency, plosive, sounds as well as sudden and rapid increases in amplitude. The adjustment of variable resistor R-OFFSET shown in FIG. 9 is performed in order that the signal received into the LOW-PASS FILTER DIFFERENTIAL AMPLIFIER 103 as signal FILTER NETWORK OUTPUT may be substantially balanced in its D.C. components. This adjustment will be further discussed when adjustment of resistor R-TRIM, also shown in FIG. 9, is discussed in conjunction with the ABSOLUTE VALUE DETECTOR 104 shown in FIG. 1 and in upcoming FIG. 5.

Momentarily referencing FIG. 1, it will be seen that the PREAMPLIFIED, FILTERED, INPUT SIGNAL (shown in FIG. 4 and FIG. 5) which was formed by amplification in INPUT PREAMPLIFIER 102, and which was low pass filtered in LOW-PASS FILTER DIFFERENTIAL AMPLIFIER 103 and associated external components, is distributed in parallel to AGC AMPLIFIER 107 and to the AUTOMATIC GAIN CONTROL CIRCUIT of the present invention. Such receipt of an input-type signal in parallel with its receipt by the amplifier for which gain will be controlled places the AUTOMATIC GAIN CONTROL CIRCUIT of the present invention in a feed forward configuration. The input signal is being fed forward to the AUTOMATIC GAIN CONTROL CIRCUIT simultaneously that it is, in parallel, fed to that very AGC AMPLIFIER 107 for which gain will be controlled by action of such AUTOMATIC GAIN CONTROL CIRCUIT. Such feedforward design particularly makes that the attack time, being that time within which the AUTOMATIC GAIN CONTROL CIRCUIT will adjust to changes in the amplitude of the input signal, will be very fast and will be essentially equivalent to the input frequency up to the bandwidth. The AUTOMATIC GAIN CONTROL CIRCUIT of the present invention thus offers a very fast attack time, or adjustment of gain responsive to the input signal, regardless of the fact that the release time, being that time upon which a higher gain will be recovered post the occurrence of a high amplitude input signal, will later be taught to be independently controllable, and independently controllable at two rates, within and by the circuit of the present invention.

Entering into explanation of the present invention of an AUTOMATIC GAIN CONTROL CIRCUIT as shown in FIG. 1, it will be realized that the circuit could be represented to be partitioned elsewise than by the particular three blocks shown in FIG. 1. For example, the detection and holding of a peak absolute value of an input signal, now represented by the circuitry of block 104 and part of block 105, could have been represented as one block. For example, the holding of such peak value, which is substantially accomplished in the capacitor connected to pin 6, could have been shown as a separate block. For example, the driving of the signal accomplishing gain control received at AGC AMPLIFIER 107 responsively to the charge held on such capacitor attached to pin 6, which driving is now shown to be accomplished by PEAK SENSE AND HOLD 105, could have been shown to transpire in a separate circuit block. Correspondingly, the explanation now presented of the present invention of an AUTOMATIC GAIN CONTROL CIRCUIT as divided into three functional blocks, or areas, should be considered to be for convenience only. The function and operation of the AUTOMATIC GAIN CONTROL CIRCUIT is petitionable in various manners, and with such petitions being ascribed various names.

A schematic diagram of the ABSOLUTE VALUE DETECTOR 104, previously seen in FIG. 1 as a first part of the AUTOMATIC GAIN CONTROL CIRCUIT of the present invention is shown in FIG. 5. The ABSOLUTE VALUE DETECTOR 104 contains transistors Q 151 through Q 159 and Q 1051 through Q 1511 and resistors RD51 through RD54. The purpose of the circuit is to full wave rectify the received PREAMPLIFIED, FILTERED, INPUT SIGNAL and to apply it as the ABSOLUTE VALUE SIGNAL to the next occurring PEAK SENSE AND & HOLD circuit 105 (shown in FIG. 1 and FIG. 6). The PREAMPLIFIED, FILTERED, INPUT SIGNAL is buffered by an amplifier consisting of transistors Q151, Q152, Q1051 and Q153 which form a simple operational amplifier with a feedback path split by active transistors Q156 and Q1052. The active diodes Q156 and Q1052 half wave rectify the input signal: one rectifying the positive half and the other rectifying the negative half of the input signal. During a positive signal, Q156 is active and Q1052 is off. Feedback then proceeds via resistors RD51 and RD53 from the output of the simple, second, operational amplifier which is made up of Q157, Q158, Q159 and Q1053, and which is operating in the non-inverting mode. During a negative signal, Q156 is off and Q1052 is active. The second operational amplifier then inverts to produce a positive output. The two half wave rectified signals are summed by transistors Q157 and Q158 to provide a full wave rectified output signal which is driven by transistor Q159. The full wave rectified signal peak from the negative half of the filtered input signal is amplitude balanced with the peak from the positive half of the filtered input signal in accordance with the trim voltage applied as signal TRIM to pin 5. The circuitry for the provision of such voltage TRIM may be observed by momentary reference to FIG. 9. The full wave rectified signal occurring as the ABSOLUTE VALUE SIGNAL is next applied to the PEAK SENSE AND HOLD circuit 105, shown in FIG. 1 and FIG. 6. The output polarity of the ABSOLUTE VALUE SIGNAL is always positive.

The adjustment of variable resistors R-TRIM, concerned with balancing the gain given to the negative and positive one-halves of the input signal within ABSOLUTE VALUE DETECTOR 104, and of variable resistance R-OFFSET, concerned with balancing the signal INPUT PREAMPLIFIER OUTPUT as is passed through the filter network to be received as signal FILTER NETWORK OUTPUT to LOW-PASS FILTER PREAMPLIFIER 103, is as follows. Referencing FIG. 9, as a first step the resistors R-OFFSET and R-TRIM should be set to their center values. Then, as a second step, the input signal X20-IN to pin 3 of the chip should be set to the maximum level. As step three, and during the occurrence of such maximum level input signal, the peak-to-peak output voltage level of signal OUTPUT occurring on pin 9 should be noted. As step four, the input signal X20-IN should be reduced by 40 dB. As step five, the resistor R-OFFSET should be next adjusted to allow signal OUTPUT on pin 9 to add an output voltage level equal to that which was noted in step three. As step six, the level of signal X20-IN on pin 3 should be reduced to 60 dB below the level established in step two. As step seven, resistance R-TRIM should then be adjusted so that signal OUTPUT on pin 9 exhibits a voltage level which is as close as is possible to the level previously noted in step five. Steps two through seven should be repeated recursively until no appreciable further adjustments need be made.

Figure 6:
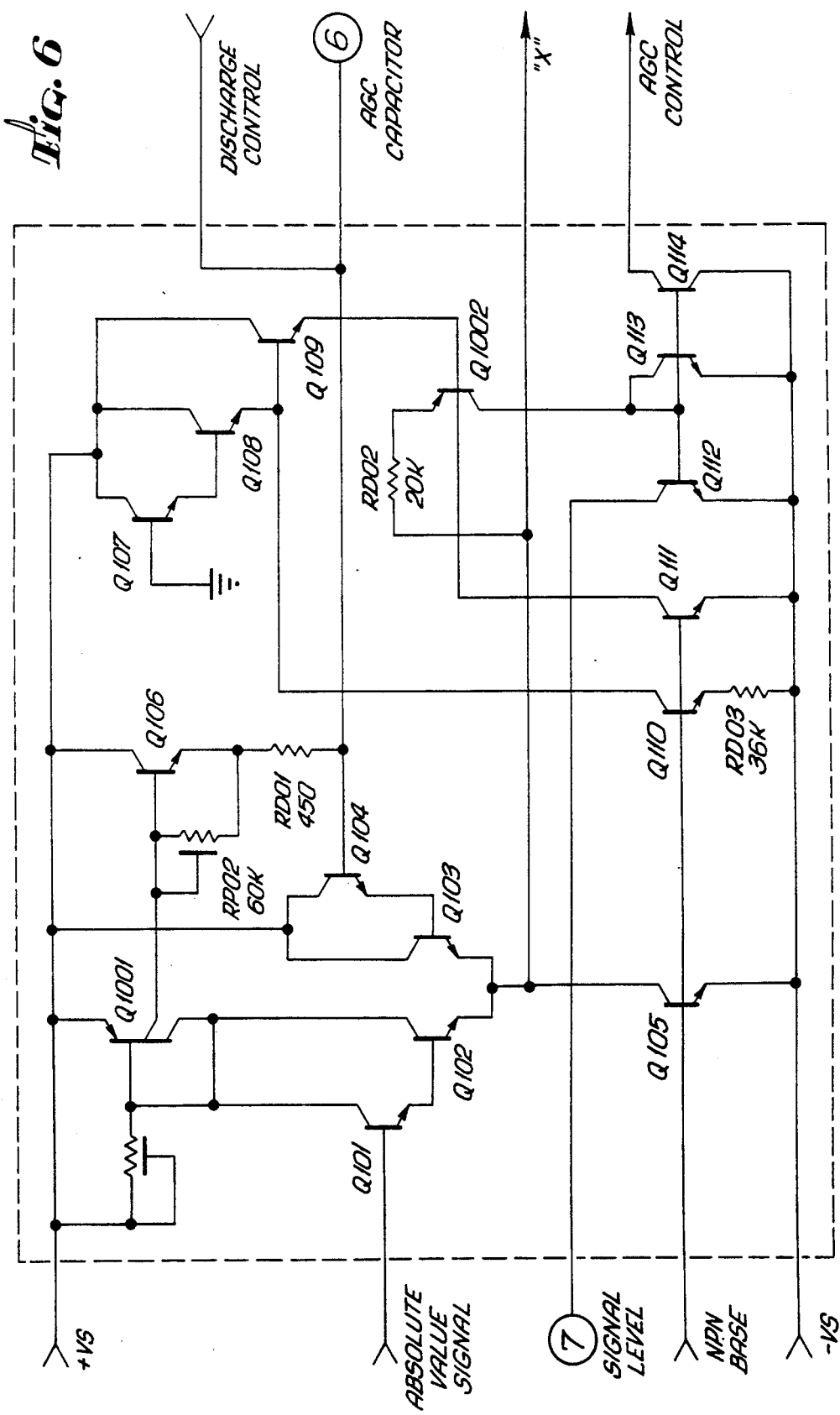
FIG. 6 shows a schematic diagram of peak sense and hold circuit part of the automatic gain control circuit of the present invention.

The schematic diagram of the PEAK SENSE AND HOLD circuit 105, previously seen in FIG. 1, is shown in FIG. 6. The PEAK SENSE AND HOLD circuit 105 includes transistors Q 161 through Q 169 and Q 1061 through Q 1062 and resistors RD61 through RD63. This circuit receives the full wave rectified signal from the ABSOLUTE VALUE DETECTOR 104 (shown in FIG. 1 and FIG. 5) as the ABSOLUTE VALUE SIGNAL. The PEAK SENSE AND HOLD circuit 105 will convert this full wave rectified signal to a current which will charge an external capacitor connected to signal AGC CAPACITOR on pin 6. This is straightforwardly accomplished as the ABSOLUTE VALUE SIGNAL is first buffered, and then applied, by connection to the emitter of transistor Q166, as signal AGC CAPACITOR. This signal, and voltage level, AGC CAPACITOR cannot be discharged through Q166. Therefore, the peak signal applied to that capacitor (shown in FIG. 9) connected to pin 6 via signal AGC CAPACITOR will be held by the capacitor until it is discharged by other means. Correspondingly, the entire PEAK SENSE AND HOLD circuit 105 will act as a peak detector, the peak-detected value of the input signal being held in the external capacitor connected to pin 6. The discharge path for such capacitor will be only through that line labelled DISCHARGE CONTROL, which will be seen to connect to DISCHARGE CONTROL 106 (shown in FIG. 1 and FIG. 7).

Continuing in FIG. 6, the external connection pin 7 labelled SIGNAL LEVEL is an open collector signal output of transistor Q1612. This pin 7 is connected to an external 10 K ohm resistance which may be observed in FIG. 9. The signal serves to indicate the level of the voltage held upon the capacitor connected to pin 6. The SIGNAL LEVEL of 0 to $-0.6$ v is usable as a measure of the amount of compression being applied to the overall input signal X20-N (or X1-N) by operation of the chip block diagrammed in FIG. 1, particularly while the AUTOMATIC GAIN CONTROL CIRCUIT controls the gain of such chip. The voltage level held by the capacitor connected to pin 6 is also used to produce the signal AGC CONTROL. The voltage level serves to control transistor Q1614 and completes the multiplier of the AGC AMPLIFIER circuit 107 (shown in FIG. 1 and FIG. 8 and to be further discussed in conjunction with FIG. 8). The signal AGC CONTROL is the connection from the PEAK SENSE AND HOLD circuit 105 to the AGC AMPLIFIER circuit 107 shown in FIG. 1. Finally, the signal line labelled "X" in FIG. 6 is that signal line, shown uppermost in a connection between PEAK SENSE AND HOLD 105 and DISCHARGE CONTROL 106 in FIG. 1, by which a signal representative of the voltage, or value, held upon the capacitor connected to pin 6 will be transmitted to DISCHARGE CONTROL circuit 106 (shown in FIG. 1 and FIG. 7) for use in comparison purposes therein.

Figure 7:
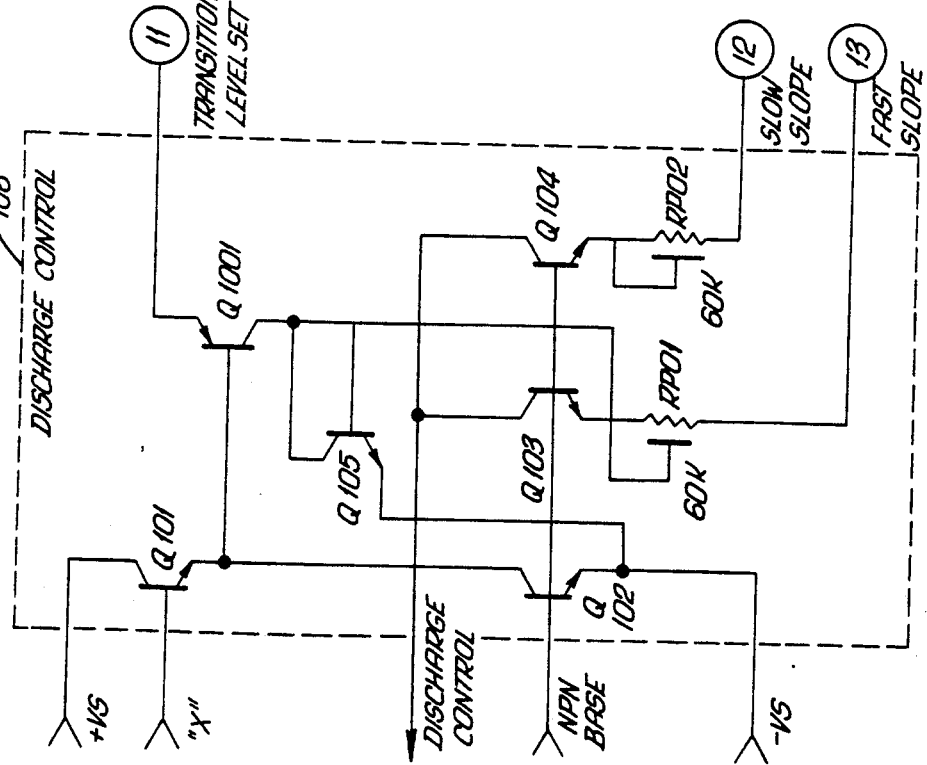
FIG. 7 shows a schematic diagram of the discharge control circuit part of the automatic gain control circuit of the present invention.

The schematic diagram of the DISCHARGE CONTROL circuit 106, previously shown in FIG. 1, is shown in FIG. 7. The DISCHARGE CONTROL circuit 106 comprises transistors Q 171 through Q 175 and transistor Q 1071 and resistors RD71 through RD72. The circuit receives signal "X" from the PEAK SENSE AND HOLD circuit 105 (shown in FIG. 1 and FIG. 6) as an indication of the magnitude of the voltage held on the external capacitor connected to chip pin 6. The DISCHARGE CONTROL circuit 106 will act to enable one or more discharge paths to drain current, and charge, from this external capacitor connected to chip pin 6. This discharge will occur through signal DISCHARGE CONTROL. To accomplish this discharge, the voltage of signal "X" as buffered in transistor Q171 will be compared in transistor Q1071 with the voltage signal TRANSITION LEVEL SET received on pin 11. When the compression level voltage indicated by signal "X" is more positive than the voltage indicated by signal TRANSITION LEVEL SET, then two discharge paths will be available to the capacitor network connected to signal DISCHARGE CONTROL: a first discharge path through Q174 and circuit elements connected to pin 12 SLOW SLOPE, and a second discharge path through transistor Q173 and circuit elements connected to pin 13 FAST SLOPE. When the compression level voltage signal "X" becomes more negative than the externally set transition level voltage TRANSITION LEVEL SET on pin 11, then the DISCHARGE CONTROL circuit 106 will act to disconnect any discharge through pin 13 FAST SLOPE by turning off transistor Q173, and the only discharge path available will be through transistor Q174 and the components connected to pin 12 SLOW SLOPE. This discharge path through the components connected to pin 12 SLOW SLOPE is necessarily less rapid than the simultaneous discharge through components within this path and additionally through components connected to pin 13 FAST SLOPE. Therefore, when discharge through the SLOW SLOPE and FAST SLOPE paths are enabled in parallel, then the capacitor connected to chip pin 6, and being discharged through signal DISCHARGE CONTROL shown in FIG. 7, will discharge more rapidly than when only the SLOW SLOPE path of discharge is provided. It should be recalled that the higher the voltage held on the external holding capacitor connected to chip pin 6, the smaller of the gain of the AGC AMPLIFIER 107 (shown in FIG. 1 and FIG. 8).

The external components connected to pin 12 SLOW SLOPE, pin 13 FAST SLOPE, and pin 11 TRANSITION LEVEL SET may be observed by reference to FIG. 9. The discharge of the capacitor, which will be equivalent to the release time of the gain of the gain controlled amplifier, may be considered to comprise a straight line slope relating the voltage on the capacitor (being discharged) versus time. The two discharge paths present curves of two such slopes, a respective fast and slow slope. The resistor RS shown in FIG. 9 will determine the point in time when the two slopes intersect, and the resistor RF will determine the ratio of the two slopes. The variable resistance connected to pin 11 TRANSITION LEVEL SET will determine the intersection of the two curves. The variable resistance determines that point relative to the charge stored upon the external capacitor (which charge is itself relative to the amplitude of the input signal) whereat discharge will change from being only available through pin 12 SLOW SLOPE to being available through both pin 12 SLOW SLOPE and pin 13 FAST SLOPE. Each of the intersection point, the relative ratio of the slopes, and the absolute value of the first slope will all be variable. Variability will be possible from one extreme setting of the variable resistance establishing a release time which is so fast, less than one millisecond, so as to essentially be but of a single slope. Variability at the other extreme setting of the variable resistance will establish a release time which may be quite slow, up to four seconds, with the point at which capacitor discharge will change over from one release rate to the other being determinable at and for any level of input signal.

Figure 8:
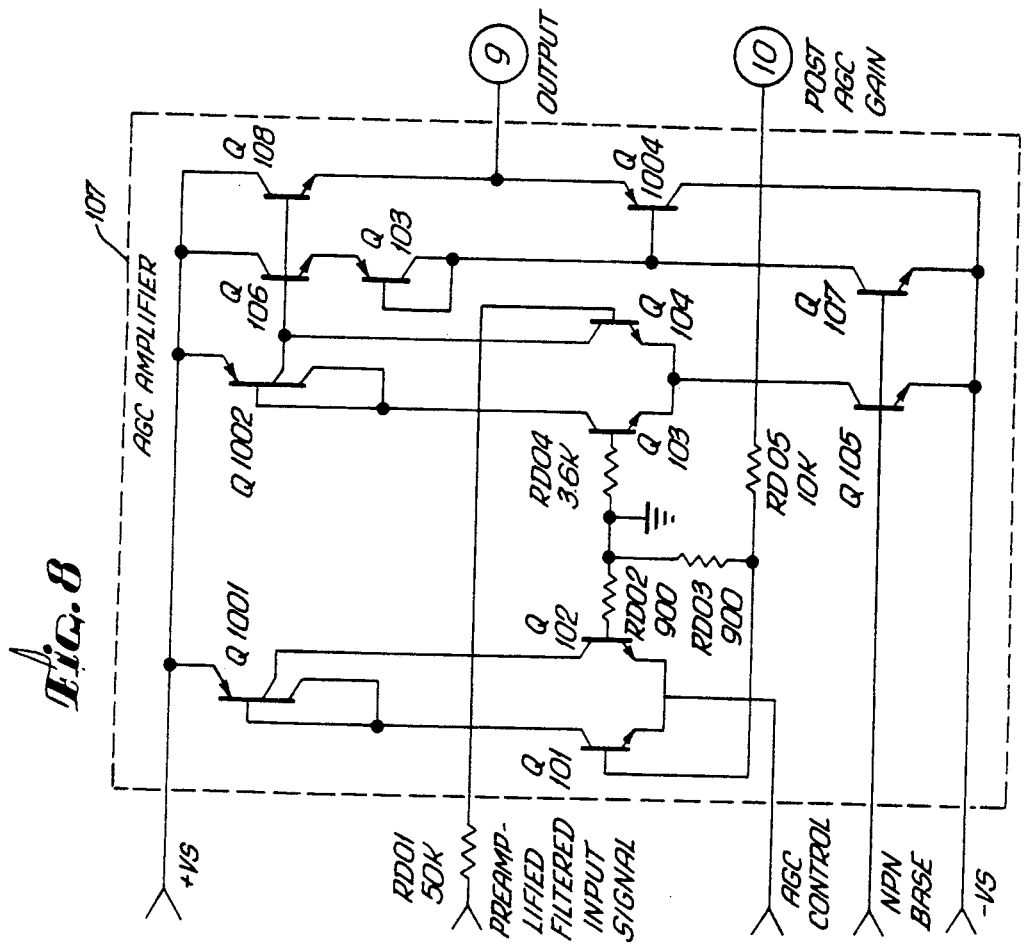
FIG. 8 shows a schematic diagram of the AGC amplifier which is implemented along with the automatic gain control circuit of the present invention upon a monolithic integrated circuit chip.

Finally, as circuitry controlled by the AUTOMATIC GAIN CONTROL circuit of the present invention, the AGC AMPLIFIER circuit 107, previously shown in FIG. 1, is shown in schematic diagram in FIG. 8. The AGC AMPLIFIER 107 includes transistors Q 181 through Q 188 and Q 1081 through 1084 and resistors RD81 through RD84. The AGC AMPLIFIER circuit 107 is a current-controlled-gain circuit which receives the PREAMPLIFIED, FILTERED, INPUT SIGNAL from the LOW-PASS FILTER DIFFERENTIAL AMPLIFIER 103 (shown in FIG. 1), and which amplifies such signal in accordance with the gain control current AGC CONTROL received from the PEAK SENSE AND HOLD circuit 105 portion of the AUTOMATIC GAIN CONTROL circuit (shown in FIG. 1 and FIG. 7). The AGC AMPLIFIER 107 is essentially an operational amplifier capable of driving into a 10 K ohm load. The output gain of this entire stage, exclusive of the AUTOMATIC GAIN CONTROL circuitry, is externally variable using a single potentiometer connected between pin 9 (carrying signal OUTPUT) and pin 10 (labelled POST-AGC GAIN). This potentiometer, or variable resistance, may be observed as resistor RO (VOLUME) in FIG. 9. The signal path through this variable resistance, which may be observed in FIG. 9 and FIG. 8, creates a feedback path within the AGC AMPLIFIER, allowing maximum gain to be obtained. The gain is normally controlled by the user of the chip device for sound amplification who controls such resistance R0 (VOLUME) in order to establish the perceived volume at a maximum comfortable level.

Figure 10:
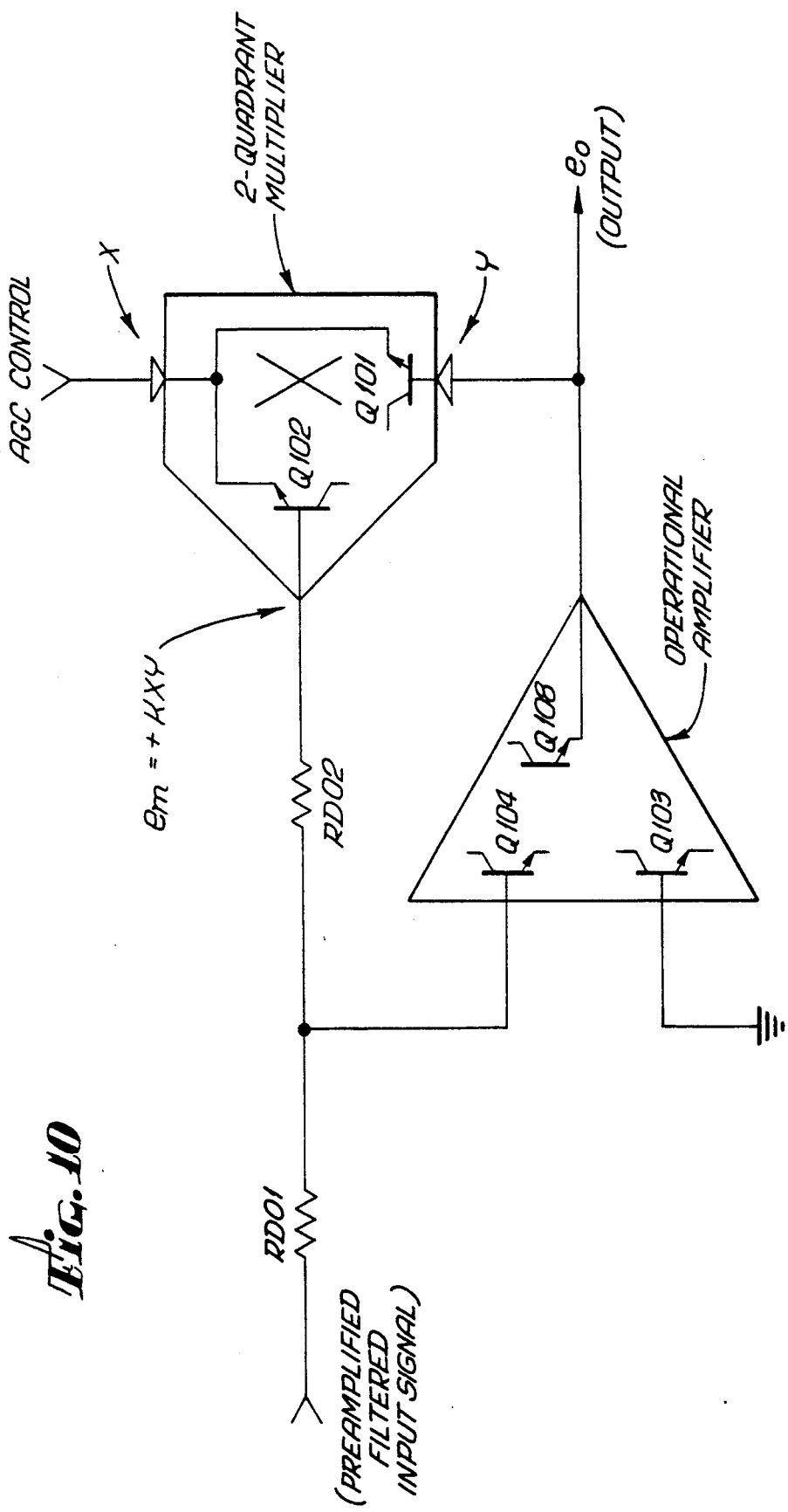
FIG. 10 shows a block diagram of the AGC amplifier shown in FIG. 8.

A block diagram of the AGC AMPLIFIER circuit 107 is shown in FIG. 10 in order that its operation may be more clearly understood. It consists of an OPERATIONAL AMPLIFIER including transistors Q183, Q184, and Q188 (shown in FIG. 8) and a 2-QUADRANT MULTIPLIER including transistors Q181 and Q182 (shown in FIG. 8). The AGC CONTROL is a current, and the input signal EIN, which is actually the PREAMPLIFIED, FILTERED INPUT SIGNAL shown in FIG. 1 and FIG. 8, is divided by the signal AGC CONTROL, also shown in FIG. 1 and FIG. 8, thereby obtaining the inverse proportionality. In other words, gain is a function of 1 divided by the AGC CONTROL. The circuit analysis of the AGC AMPLIFIER circuit 107, shown in FIG. 8 and block diagrammed in FIG. 10 (with the variable resistor RO Volume control (FIG. 9) set to 0 resistance), is as follows using the abbreviated nomenclature of FIG. 10:

$$Y = E_O \tag{1}$$

$$E_m = +K \cdot X \cdot E_o \tag{2}$$

$$X = AGC \tag{3}$$

$$E_m = K \cdot AGC \cdot E_o \tag{4}$$

$$E_m = E_{in} \cdot R2/R1 \tag{5}$$

$$K \cdot AGC \cdot E_o = E_{in} \cdot R2/R1 \tag{6}$$

$$E_o = E_{in} \cdot R2/(R1 \cdot AGC \cdot K) \tag{7}$$

where K, R1 and R2 are fixed:

$$E_o = E_{in} \cdot K'/AGC \tag{8}$$

with volume control in the circuit:

$$Y = K_{vc} \cdot E_o \tag{9}$$

$$E_o = E_{in} \cdot K'/(AGC \cdot K_{vc}) \tag{10}$$

therefore we have a divider:

$$E_o = E_{in} \cdot K''/AGC \tag{11}$$

The recommended connections to the chip containing the AUTOMATIC GAIN CONTROL circuit of the present invention are shown in FIG. 9. The nominal values of resistive and capacitive components used are shown therein. Interconnections to the chip as indicated are primarily for its intended usage in the amplification of sound, particularly of ambient environmental and speech sound in order to produce as signal OUTPUT on pin 9 an amplified signal capable of driving a speaker for the hearing impaired. Equations pertinent to the operation of the chip are:

RG is defined as RGA in parallel with RGB, in K Ohms $$\text{Post-AGC Gain} = \frac{(RO + 10.9)}{34.6}$$

The slope of the AGC discharge when:
ID is defined as the current I of capacitor CA, and RF and RS are in K Ohms is:

$$RF = RS = \left[ \frac{.026}{ID} \text{LN} \frac{(2 \times 10^{-5})}{ID} \cdot - 60 \, K \, \text{Ohms} \right]$$

where LN means natural log

Figure 11:
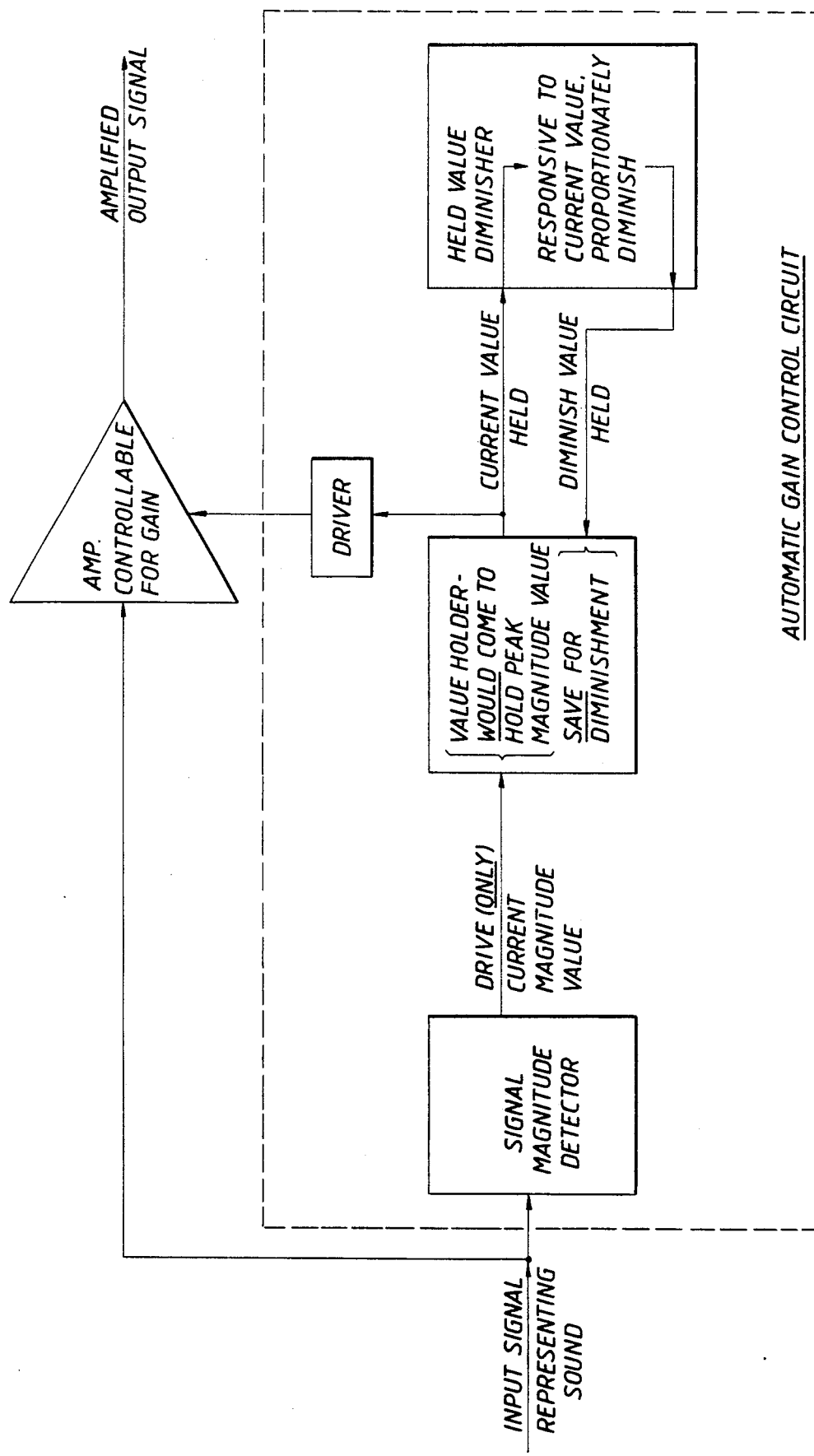
FIG. 11 shows a summary functional block diagram of the present invention.

In summary, the electrical operation of the circuit of the present invention is shown in a preferred embodiment within the schematic diagrams of FIG. 1 to FIG. 9. A summary functional block diagram of the invention is shown in FIG. 11. The automatic gain control circuit in a feed forward configuration which has been described permits of a uniformly fast attack time at a high sensitivity to signals of any frequency throughout the amplified bandwidth. Because of the dual recovery time, the present invention will be particularly supportive of accommodating the requirements of 1) amplifying soft environmental sounds, and 2) amplifying speech sounds including plosive sounds, to the hearing impaired. A person with impaired hearing desires to hear the soft environmental sounds around him, but amplification of such soft environmental sounds during the presence of human speech would interfere with speech discrimination and such sounds need to correspondingly be suppressed. A person with impaired hearing usually has a limited amplitude dynamic range over which hearing is sensitive, and resultantly needs the amplitude of sound to be compressed so that normal sounds, including speech dynamics, will not exceed this sensitivity and comfort range. Additionally, when an artificial hearing device of the implanted electrode type is used by a person to aid or replace hearing loss, great care must be maintained to ensure that the amplitude of electrical signals applied to the electrodes is within the person's comfort zone irrespective of the corresponding sound signals to be heard.

The automatic gain control circuit of the present invention realizes these somewhat contradictory goals in a circuit having two release rates. In the absence of speech, the environmental background sounds will be clearly heard. During this occurrence, and also during the presence of speech only slightly louder than the background, the SLOW SLOPE release rate of the AUTOMATIC GAIN CONTROL circuit will be enabled, allowing the overall sound level, that of speech, to control the gain and to suppress the background lower level signals without such lower level background signals coming in during normal pauses in speech. In other words, the gain of the amplifier for which gain is controllable will be controlled to have a slow release time, and the gain will remain relatively constant (for a period up to four seconds) during the presence of environmental or normal speech. At the same time, the plosive sounds present in normal speech must be amplified with reduced gain or they will cause discomforture to the hearer. Following the occurrence of such plosive sounds, the gain must be quickly recovered to moderate or high levels in order that soft sounds in speech following such plosive sounds should be clearly heard. The circuit of the present invention will function so that the FAST SLOPE recovery of the AUTOMATIC GAIN CONTROL circuit is enabled post the occurrence of large amplitude plosive sound signals, and the gain of the amplifier for which gain is controllable will quickly return to a gain appropriate to the overall speech level. The user of the device incorporating the AUTOMATIC GAIN CONTROL circuit of the present invention has control of both sensitivity (as the pre-AGC GAIN CONTROL), and of volume. Further control is available between the FAST and SLOW SLOPE recovery period, thereby allowing optimization for operation at different ratios of background noise to speech level.

While the present invention has been described in terms of a preferred embodiment using bipolar transistor circuitry implemented in a custom integrated circuit, it may be seen that many other implementations of the present invention are possible. For example, a MOSFET or CMOS implementation of the circuitry is possible, as is a discrete rather than integrated circuit design. Also, the present invention may be implemented employing digital logic for the AGC in place of the analog circuitry disclosed herein. Such a digital embodiment could, for example, employ counters in place of the capacitors with relatively straightforward design modifications. Also, while the preferred embodiment has been described with two recovery rates, multiple rates of recovery or even continuously variable recovery rates are within the scope of the present invention.

Once the concept of an adaptive release time for an automatic gain control circuit in a feed forward configuration is recognized, as is taught by the present invention, it is possible to condition such adaptive release upon further, and more complex, conditions other than simply the currently stored peak magnitude value of the input signal. For example, both such stored peak magnitude value plus another quantity, possibly the current input signal itself or possibly an historical accumulation relating to the rate at which a certain path of adaptive release is (repetitively) being entered into, could be molded into control of AGC release time. Such a method, including even more sophisticated factors, is within the scope of the current invention.

It will be apparent to one skilled in the art that other changes in the details of the preferred embodiment described above may be made, and that such alternate embodiments are within the scope of the present invention. Thus, the present invention is not intended to be limited to the above-described preferred embodiment and is instead best described by the following claims.

What is claimed is:

1. In a hearing device including an input transducer for converting sounds of differing loudness into an electrical input signal having a dynamic range, an output device selected from a group consisting of: (i) transducers for converting electrical signals into vibrations and (ii) audio electrodes; and coupling means for electrically coupling the input transducer to the output transducer, said coupling means containing the improvement comprising:
   a means for compressing the dynamic range of the input signals coupled to the input and output transducers, wherein the compression means has a controllable gain that may be altered at variable rates; and
   a control means coupled to the compressing means for rapidly increasing the gain following loud sounds and for more slowly increasing the gain following quieter sounds.

2. The hearing device of claim 1, wherein the coupling means includes:
   a storage means coupled to be responsive to the input signal for storing a value representative of the loudness of the sound; and
   means responsive to the storage means for increasing the gain if the sound is relatively quiet and decreasing the gain if the sound is relatively loud.

3. The hearing device of claim 2, wherein the control means includes a means for diminishing the stored value relatively quickly if the stored value is relatively large and for diminishing the stored value relatively slowly if the stored value is relatively small.

4. The hearing device of claim 3, wherein the storage means is a capacitor.

5. The hearing device of claim 2, wherein the storage means stores a value representative of the peak loudness of the sound.

6. The hearing device of claim 1, wherein the control means increases the gain rapidly while the gain of the compressing means is below a predetermined level and slows the rate of increase of the gain when the gain exceeds a predetermined level.

7. The hearing device of claim 1, wherein the means for compressing and the control means comprise a feedforward gain control amplifier.

8. An electronic circuit for a hearing device for controlling the amplification of an electrical signal representing variable levels of loudness of sound, the circuit comprising:
   an automatic gain control amplifier having an input for receiving the electrical signal, an output for producing an amplified signal, and a gain control node; and
   control means, operative in response to the electrical signal and coupled to the control node, for increasing the gain of the amplifier rapidly following an electrical signal representative of loud sounds and for increasing the gain of the amplifier slowly following an electrical signal representative of quiet and moderate sounds.

9. The electronic circuit described in claim 8, wherein the control means stores a value proportional to a peak value of the input electrical signal and further includes means for subsequently diminishing the stored value.

10. The electronic circuit described fin claim 9, wherein the control means controls the gain in an inverse relationship to the stored value.

11. The electronic circuit described in claim 10, wherein the control means quickly increases the gain while the stored value is above a predetermined threshold and increases the gain of the amplifier more slowly when the stored value falls below the threshold.

12. The electronic circuit described in claim 11, wherein the predetermined threshold is adjustable.

13. The electronic circuit described in claim 11, wherein the control means controls the rate of increase of the gain by rapidly diminishing the stored value while the value is above a predetermined threshold and more slowly diminishing the value while the value is below the threshold.

14. The electronic circuit described in claim 13, wherein the control means includes a capacitor in which the value is stored, and a fast and a slow discharge path coupled to the capacitor for rapidly and more slowly diminishing the stored value, respectively.

15. An electronic circuit for a hearing device for controlling the amplification of an input electrical signal representing variable levels of loudness of sound, the circuit comprising:
   an alterable dynamic range compressor having an input, an output and a control node, the amount of compression varying in response to the signal at the control node; and
   a control circuit having an input node coupled to one of the input and the output of the compressor, the control circuit also having an output node coupled to the control node, wherein
   the control circuit generates a control signal at the output node in response to a signal at the input node, with the control circuit having a fast attack time in response to a signal at the input node and a slow release time in response to signals at the input node representing quieter sounds and a faster release time in response to signals at the input node representing louder sounds.

16. The electronic circuit of claim 15, wherein the input node of the control circuit and the input of the compressor are both coupled to respond to the input electrical signal, whereby a feed forward configuration is achieved.

17. The electronic circuit of claim 16, wherein the compressor includes an amplifier coupled to the input and output of the compressor and a divider having a first input and a first output, the first input of the divider being coupled to the control node and the output of the divider being coupled to the input of the amplifier.

18. The electronic circuit of claim 17, wherein the divider has a second input, the second input being coupled to the output of the amplifier, wherein the divider normalizes the output of the amplifier of the compressor to the input signal.

19. The electronic circuit of claim 18, wherein the control circuit includes a discriminator coupled between the input node and the output node for deciding if the input signal represents plosive or non-plosive sounds.

20. The electronic circuit of claim 18, wherein the divider is comprised of a pair of transistors, each transistor having an emitter, a base and a collector, the two emitters being coupled to the control node and one base of one transistor being coupled to the output of the compressor.

21. An electronic circuit for a hearing device that receives an input signal having a dynamic range and having peaks, said circuit comprising:
- a first amplifier with an output coupled to be responsive to the input signal;
- a divider having an input coupled to be responsive to at least the peaks of the input signal and coupled to the amplifier such that the output of the amplifier is divided by a value directly proportional to the peaks of the input signal.

22. The electronic circuit of claim 21, wherein the circuit further includes a peak detector that produces as its output an absolute value peak signal representative of the absolute value of the peaks of the input signal, the output of the peak detector being coupled to the input of the divider.

23. The electronic circuit of claim 22, wherein the peak detector has a fast attack time for detecting peaks and has a fast release time for the detected peaks that represent loud noises and a slow release time for the detected peaks that represent relatively quiet noises.

24. The electronic circuit of claim 23, wherein the divider comprises an automatic gain control amplifier having an output coupled to the input of the first amplifier, a control node coupled to the output of the peak detector and an input coupled to the output of the first amplifier.

25. The electronic circuit of claim 22, wherein both the divider and the first amplifier are each comprised of an operational amplifiers having at least two inputs and one output, the gain of the operational amplifier in the divider being alterable in response to the output of the peak detector, and wherein
the output of the operational amplifier in the divider and one input of the operational amplifier of the first amplifier are coupled to the input signal, and
a first input of the operational amplifier in the divider is coupled to the output of the first amplifier.

26. The electronic circuit of claim 25, wherein the peak detector has a fast attack time for detecting peaks in the input signal and has a fast release time for the detected peaks in the input signal that represent relatively loud noises and a slow release time for the detected peaks in the input signal that represent relatively quiet noises.

27. An electronic circuit for a hearing device for controlling the amplification of an input electrical signal representing variable levels of loudness of sound, the circuit comprising:
- a discrimination processor operative in response to the input signal for distinguishing between plosive and non-plosive sounds, and
- a compressing processor for compressing the input signal, the compressing processor having an output and coupled to receive the input signal, wherein the compressing processor is operative in response to the discrimination processor and the amount of compression decreases quickly following plosive sounds and decreases slowly following non-plosive sounds.

28. The electronic circuit described in claim 27, wherein the discrimination processor further includes a peak detector for detecting the peaks of the input signal and furnishes a signal proportional to the peaks of the input signal to the compressor and wherein the compressor comprises:
- an amplifier coupled to receive the input signal; and
- a divider coupled to the peak detector for dividing the output of the compressor processor by the output of the peak detector.

29. The electronic circuit of claim 28, wherein the divider has an input coupled to the output of the compressing processor and the divider has an output that is coupled to the input signal.

30. The electronic circuit of claim 29, wherein the divider is a gain control amplifier having a control node and the control node is coupled to the peak detector.

* * * * *